(12) United States Patent
Mikuriya et al.

(10) Patent No.: US 11,127,584 B2
(45) Date of Patent: Sep. 21, 2021

(54) METHOD OF PRODUCING CARRIER AND METHOD OF POLISHING WAFER

(71) Applicant: SUMCO CORPORATION, Tokyo (JP)

(72) Inventors: Shunsuke Mikuriya, Tokyo (JP); Tomonori Miura, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 107 days.

(21) Appl. No.: 16/638,193

(22) PCT Filed: Aug. 14, 2018

(86) PCT No.: PCT/JP2018/030303
§ 371 (c)(1),
(2) Date: Feb. 11, 2020

(87) PCT Pub. No.: WO2019/044497
PCT Pub. Date: Mar. 7, 2019

(65) Prior Publication Data
US 2020/0365387 A1    Nov. 19, 2020

(30) Foreign Application Priority Data
Aug. 30, 2017   (JP) .............................. JP2017-165387

(51) Int. Cl.
*H01L 21/02*    (2006.01)
*B24B 37/28*    (2012.01)

(52) U.S. Cl.
CPC ........ *H01L 21/02016* (2013.01); *B24B 37/28* (2013.01)

(58) Field of Classification Search
None
See application file for complete search history.

(56) References Cited

U.S. PATENT DOCUMENTS

2008/0166952 A1* 7/2008 Ueno .................. B24B 37/28
                                                              451/41
2008/0318493 A1* 12/2008 Aida .................. B24B 37/28
                                                              451/36
(Continued)

FOREIGN PATENT DOCUMENTS

JP    H04-94122 A    3/1992
JP    H08-236489 A    9/1996
(Continued)

OTHER PUBLICATIONS

ISR for PCT/JP2018/030303, dated Nov. 6, 2018 (w/ translation).
(Continued)

*Primary Examiner* — Khaja Ahmad
(74) *Attorney, Agent, or Firm* — Greenblum & Bernstein, P.L.C.

(57) ABSTRACT

Provided a method of producing a carrier which make it possible to prevent the reduction in the flatness of a semiconductor wafer even if the semiconductor wafer is subjected to repeated double-side polishing procedures. The method of producing a carrier including a metal portion and a ring-shaped resin portion includes: a preparation step of preparing the metal portion and the resin portion (Step S1); a placement step of placing the resin portion in the retainer opening in the metal portion (Step S2); and a resin portion polishing step of polishing both surface of the resin portion (Step S4). The method includes, prior to the resin portion polishing step (Step S4), a production stage swelling step of swelling the resin portion placed in the retainer opening in the metal portion by impregnating the resin portion with a first liquid (Step S3).

19 Claims, 8 Drawing Sheets

(56) References Cited

U.S. PATENT DOCUMENTS

2011/0104995 A1* 5/2011 Ueno ................... B24B 37/28
451/41
2012/0100788 A1 4/2012 Yasuda et al.

FOREIGN PATENT DOCUMENTS

| JP | H11-99471 A | 4/1999 |
|----|-------------|--------|
| JP | 2011-25322 A | 2/2011 |
| JP | 5648623 B2 | 1/2015 |

OTHER PUBLICATIONS

Office Action issued in TW App. No. 107123945, dated Sep. 19, 2019 (w/ translation).
IPRP for PCT/JP2018/030303, dated Mar. 3, 2020 (w/ translation).
Office Action for KR App. No. 10-2020-7002870, dated May 10, 2021 (w/ translation).

* cited by examiner

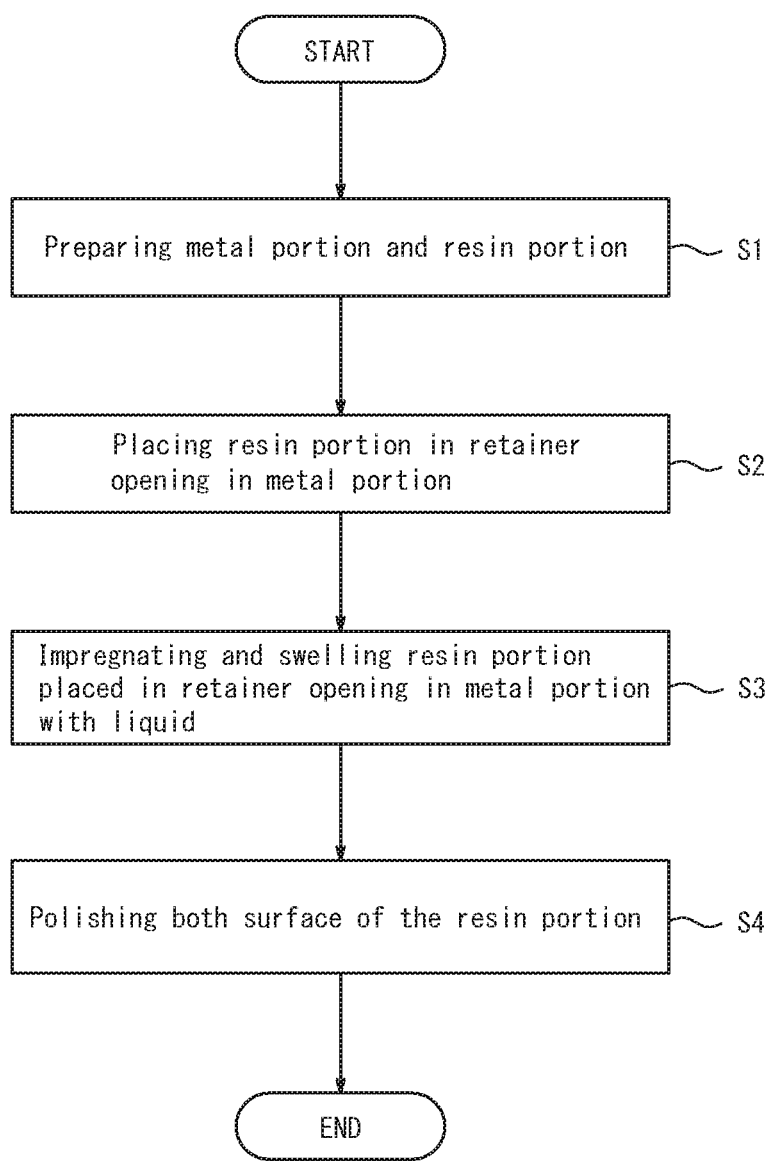

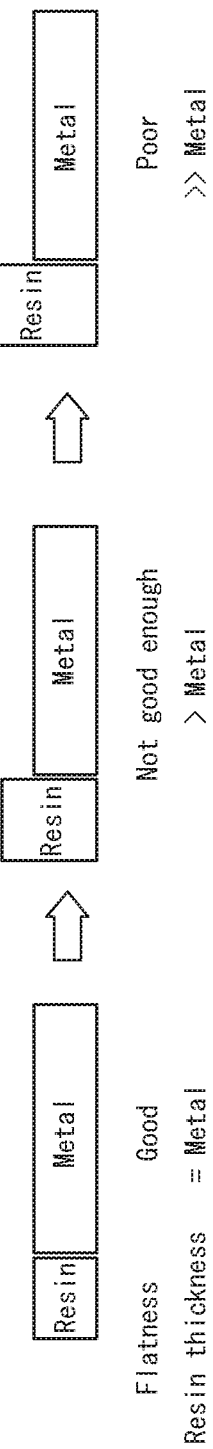

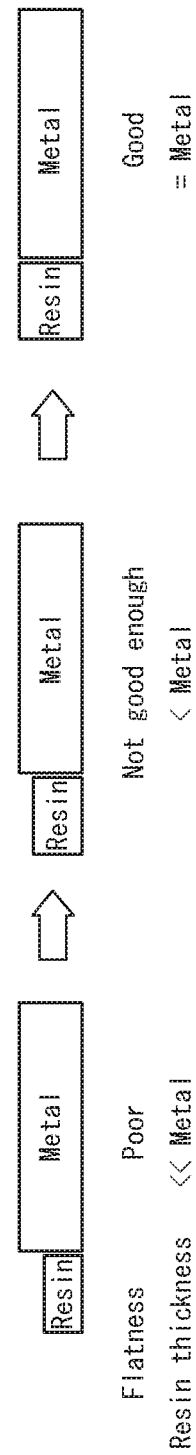

METHOD OF PRODUCING CARRIER AND METHOD OF POLISHING WAFER

TECHNICAL FIELD

This disclosure relates to a method of producing a carrier and a method of polishing a wafer.

BACKGROUND

In the production of semiconductor wafers used as substrates for semiconductor devices, with a view to achieve higher flatness and better surface smoothness, a double-side polishing step of polishing both surfaces of each semiconductor wafer by placing the semiconductor wafer between one pair of plates to each of which a polishing pad is attached and supplying a polishing slurry to the wafer. Here, the semiconductor wafer is held by a carrier.

For the above carrier, the use of a carrier made of a metal such as stainless steel or titanium is mainstream. FIG. 1 depicts an example of the structure of a typical carrier (for example, see JP 5648623 B (PTL 1)). A carrier 1 depicted in the diagram includes a metal portion 11 as a carrier body, and is configured so that a semiconductor wafer is retained in a retainer opening 12 provided in the metal portion 11.

In double-side polishing a semiconductor wafer retained in the retainer opening 12 of the metal portion 11, the semiconductor wafer may fracture when a peripheral portion of the semiconductor wafer comes in contact with an inner wall 12a defining the retainer opening 12. To address this, a ring-shaped resin portion 13 made of a resin softer than metals is placed along the inner wall 12a of the retainer opening 12 in the metal portion 11 to protect the peripheral portion of the semiconductor wafer.

The carrier 1 is produced, for example, as follows. First, a board material made of a metal such as stainless steel is worked into the shape of a carrier, and a wafer retainer opening is provided to form the metal portion 11. Further, a resin material made of a resin such as polyvinyl chloride (PVC) is cut into a ring shape, and lapping and polishing are performed to form the ring-shaped resin portion 13.

Next, the resin portion 13 prepared as described above is fit into the retainer opening 12 in the metal portion 11 and placed along the inner wall 12a of the retainer opening 12. To obtain a polished semiconductor wafer having high flatness, the thickness of the metal portion 11 and the thickness of the resin portion 13 are preferably the same. This being the case, both surfaces of the resin portion 13 are polished and part of the resin portion that sticks out from the surfaces of the metal portion 11 surface is removed by polishing so that the thickness of the metal portion 11 and the thickness of the resin portion 13 are approximately the same. Thus, the carrier 1 is obtained.

CITATION LIST

Patent Literature

PTL 1: JP 5648623 B

SUMMARY

Technical Problem

A semiconductor wafer to be polished is retained in the retainer opening 12 of the carrier 1 produced as described above, the carrier 1 is sandwiched between an upper plate and a lower plate of a double-side polishing apparatus (not shown), and the upper plate and the lower plate are then rotated with a slurry being supplied; thus, both surfaces of the semiconductor wafer can be polished. However, while the step of double-side polishing the semiconductor wafer was repeated, the flatness of the surfaces of the polished semiconductor wafer was found to be gradually reduced.

With a view to addressing the above problem, it could be helpful to provide a method of producing a carrier and a method of polishing a wafer which make it possible to prevent the reduction in the flatness of a semiconductor wafer even if the semiconductor wafer is subjected to repeated double-side polishing steps.

Solution to Problem

We propose the following features to address the above challenge.

(1) A method of producing a carrier including a metal portion having a retainer opening for retaining a semiconductor wafer, and a ring-shaped resin portion that is placed along an inner wall defining the retainer opening in the metal portion and protects a peripheral portion of the semiconductor wafer, comprising:

a preparation step of preparing the metal portion and the resin portion;

a placement step of placing the resin portion in the retainer opening in the metal portion; and a resin portion polishing step of polishing both surface of the resin portion, wherein the method comprises, prior to the resin portion polishing step, a production stage swelling step of swelling the resin portion placed in the retainer opening in the metal portion by impregnating the resin portion with a first liquid.

(2) The method of producing a carrier, according to (1) above, wherein the production stage swelling step is performed by immersing at least the resin portion in the first liquid.

(3) The method of producing a carrier, according to (1) or (2) above, wherein the production stage swelling step is performed for 24 hours or more.

(4) The method of producing a carrier, according to any one of (1) to (3) above, wherein the production stage swelling step is performed until a rate of change in a thickness of the resin portion per 24 hours becomes 0.2% or less.

(5) The method of producing a carrier, according to any one of (1) to (4) above, wherein the first liquid is one of water, a slurry, and an aqueous solution containing a surfactant.

(6) The method of producing a carrier, according to any one of (1) to (5) above, wherein the resin portion is made of one of aramid, polyamide, polyacetal, polyvinyl chloride, polypropylene, polyvinylidene fluoride, and a fluorine-based resin.

(7) The method of producing a carrier, according to (6) above, wherein the resin portion contains glass fiber.

(8) A method of polishing a wafer, comprising a wafer polishing step of polishing both surfaces of a semiconductor wafer by retaining the semiconductor wafer in the retainer opening of the carrier produced by the method of producing a carrier, according to any one of (1) to (7) above, and rotating an upper plate and a lower plate of a double-side polishing apparatus with the carrier being sandwiched between the upper plate and the lower plate, wherein the method of polishing a wafer comprises, prior to the wafer polishing step, a polishing stage swelling step of swelling the resin portion in the carrier by impregnating the resin portion with a second liquid.

(9) The method of polishing a wafer, according to (8) above, wherein the polishing stage swelling step is performed by immersing at least the resin portion in the second liquid.

(10) The method of polishing a wafer, according to (8) or (9) above, wherein a time for which the resin portion is impregnated with the first liquid in the production stage swelling step and a time for which the resin portion is impregnated with the second liquid in the polishing stage swelling step are the same.

(11) The method of polishing a wafer, according to any one of (8) to (10) above, wherein the second liquid is the same as the first liquid.

(12) The method of polishing a wafer, according to (11) above, wherein the second liquid is one of water, a slurry, and an aqueous solution containing a surfactant.

(13) The method of polishing a wafer, according to any one of (8) to (12) above, wherein the semiconductor wafer is a silicon wafer.

Advantageous Effect

The disclosed methods can prevent the reduction in the flatness of a semiconductor wafer even if the semiconductor wafer is subjected to repeated double-side polishing steps.

BRIEF DESCRIPTION OF THE DRAWINGS

In the accompanying drawings:

FIG. 2 is a flow chart of a method of producing a carrier;

FIG. 3A is a diagram illustrating the swelling of a resin portion by repeating double-side polishing steps in a conventional method;

FIG. 3B is a diagram illustrating the swelling of a resin portion by repeating double-side polishing steps in the disclosed method;

DETAILED DESCRIPTION

Method of Producing Carrier

Figure 1:
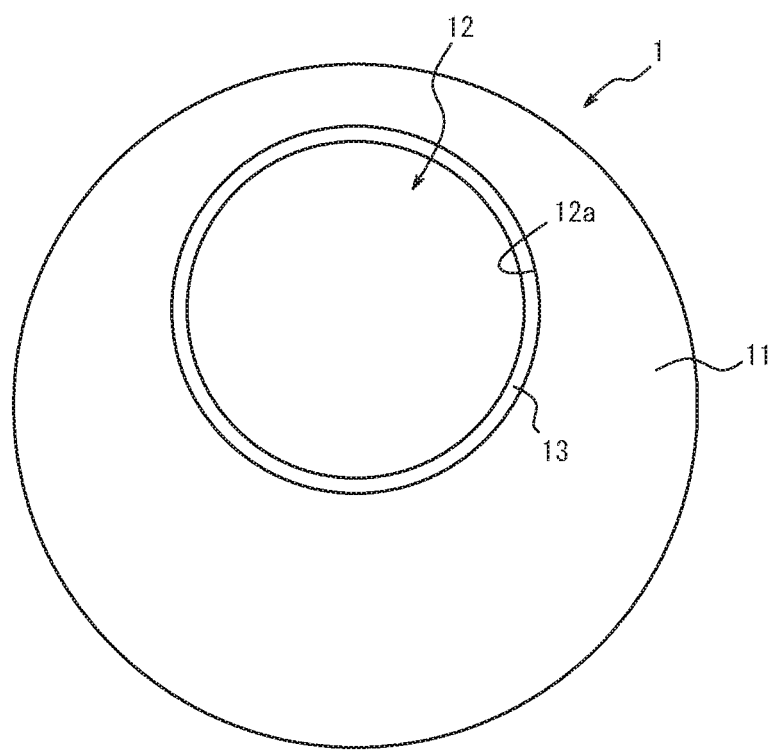
FIG. 1 is a diagram illustrating an example of a typical structure of a carrier.

Embodiments of this disclosure will now be described with reference to the drawings. The disclosed method of producing a carrier is a method of producing a carrier 1 having the typical structure depicted in FIG. 1, which carrier 1 includes a metal portion 11 having a retainer opening 12 for retaining a semiconductor wafer, and a ring-shaped annular resin portion 13 that is placed along an inner wall 12a defining the retainer opening 12 in the metal portion 11 and protects a peripheral portion of the semiconductor wafer.

FIG. 2 presents a flow chart of the disclosed method of producing a carrier; As illustrated in the diagram, the disclosed method of producing a carrier includes a preparation step of preparing the metal portion 11 and the resin portion 13 (Step S1); a placement step of placing the resin portion 13 in the retainer opening 12 in the metal portion 11 (Step S2); and a resin portion polishing step of polishing both surfaces of the resin portion 13 (Step S4). Here, the method includes, prior to the resin portion polishing step (Step S4), a production stage swelling step (Step S3) of swelling the resin portion placed in the retainer opening 12 in the metal portion 11 by impregnating the resin portion 13 with a first liquid.

As described above, while the step of double-side polishing the semiconductor wafer was repeated using a carrier produced by a conventional method, the flatness of the surfaces of the polished semiconductor wafer was found to be gradually reduced. We first closely investigated the reason for the reduction in the flatness of the wafer surfaces due to the repetition of the double-side polishing steps. The results revealed that the flatness was reduced because the resin portion 13 of the carrier 1 absorbed moisture such as slurry or pure water and swelled when being polished, and the thickness of the resin portion increased during repeated double-side polishing steps.

As described above, when the carrier 1 is produced by a conventional method, after the resin portion 13 is fitted in the retainer opening 12 in the metal portion 11, both surfaces of the resin portion 13 are polished so that the thickness of the metal portion 11 and the thickness of the resin portion 13 are approximately the same. However, as illustrated in FIG. 3A, as the double-side polishing step is repeated, the resin portion 13 absorbs moisture such as slurry or pure water and gradually swells, thus the thickness of the resin portion 13 becomes larger than the thickness of the metal portion 11. When the thickness of the resin portion 13 is larger than the thickness of the metal portion 11, polishing pads attached to the plates of a double-side polishing apparatus hardly make contact with the surfaces of the semiconductor wafer, resulting in poor flatness of the wafer surfaces.

The swelling of the resin portion 13 would have occurred also in conventional carriers. However, in recent years, the flatness required of semiconductor wafers has become increasingly high, and the influence of the swelling of the resin portion 13 which could have conventionally been ignored are considered to have come to have effects on the required flatness of the wafer surfaces.

We diligently studied ways to prevent the reduction in the wafer flatness due to the swelling of the resin portion 13 even when a double-side polishing step is repeated. As a result, we conceived of swelling the resin portion 13 by impregnating the resin portion 13 with a liquid (production stage swelling step) prior to the step of polishing both surfaces of the resin portion 13 placed in the retainer opening 12 in the metal portion 11 (resin portion polishing step), and then performing the step of polishing the resin portion (resin portion polishing step); thus, we completed this disclosure.

As illustrated in FIG. 3B, when a carrier produced by the disclosed method is in a dry state, for example, when stored, the thickness of the resin portion 13 is smaller than the thickness of the metal portion 11. Accordingly, when the double-side polishing step using the carrier in that state is performed, a polished semiconductor wafer would have low flatness. However, as the double-side polishing step is repeated, the resin portion 13 absorbs moisture such as slurry or pure water and swells, resulting in a gradual increase in the thickness of the resin portion. Further, with the increase in the thickness of the resin portion 13, the flatness of the polished semiconductor wafer is also improved. Given this situation, when the double-side polishing step is performed using the carrier 1 produced by the disclosed method, the step is preferably performed with the resin portion 13 being in a swelling state.

Thus, characteristically, prior to the polishing step of polishing both surfaces of the resin portion 13 (production stage polishing step), the swelling step of swelling by impregnating the resin portion with a liquid (production stage swelling step) is performed. Accordingly, the other steps can be performed as in conventionally known methods, and are not limited. Each step is described below.

First, in Step S1, the metal portion 11 and the resin portion 13 composing the carrier 1 are prepared (preparation step). The metal portion 11 is a main (base) member of the carrier 1, and has the retainer opening 12 for retaining a semiconductor wafer to be polished. As a material of the metal portion 11, a metal having sufficient rigidity for the double-side polishing step may be used. As such a metal, for example, stainless steel, titanium, etc. can be used.

The metal portion 11 is formed by working a board material of the metal into the shape of a carrier, and providing a wafer retainer opening. Specifically, the metal portion 11 is formed by laser machining or milling the metal board material, followed by a step of eliminating strain by heat treatment.

Further, the resin portion 13 is a member that is placed between the inner wall 12a defining the retainer opening 12 in the metal portion 11 and a peripheral portion of the semiconductor wafer, and protects the peripheral portion of the semiconductor wafer. The resin portion 13 can be made of a typical resin, such as aramid, nylon polyamide (PA), polyacetal (POM), polyvinyl chloride (PVC), polypropylene (PP), polyvinylidene fluoride (PVDF), fluorine-based resin (PFA/ETFE), etc.

Further, the resin portion 13 preferably contains glass fiber. This can increase the durability of the resin portion. This glass fiber is preferably contained with a content of 10% to 60% by volume.

Methods of forming the resin portion 13 can be classified into two types: methods of forming the resin portion 13 as a separate body from the metal portion 11 and methods of forming the resin portion 13 in the retainer opening 12 in the metal portion 11 by injection molding. When the resin portion 13 is made as a separate body from the metal portion 11, for example, a resin member made of polyamide (PA) is prepared, the thickness of the member is controlled to a desired thickness by lapping or polishing, and a ring-shaped member having an appropriate length and an appropriate thickness is cut out of the resin member.

After that, the above ring-shaped member is subjected to milling to remove burrs. Thus, the resin portion 13 is formed. A method of forming the resin portion 13 by injection molding is described in relation to the placement step of Step S2.

Next, in Step S2, the resin portion 13 is placed in the retainer opening 12 in the metal portion 11 (placement step). When the resin portion 13 is prepared as a separate body from the metal portion 11 as described above, the resin portion 13 is fitted in the retainer opening 12 in the metal portion 11. On the other hand, when the resin portion 13 is formed by injection molding, specifically, the process is performed in the following manner. First, the metal portion 11 is placed between metal molds to be sandwiched between metal molds, and a resin is flown to radially spread from the center of the retainer opening 12, followed by cooling, thus molding is performed. After that, excess resin is removed and beveling is performed. In this way, the resin portion 13 can be formed in the retainer opening 12 by injection molding.

Of the above two methods of forming the resin portion 13, injection molding is preferably used to form the resin portion 13, since the thickness of the resin portion 13 can be controlled with high precision.

Subsequently, in Step S3, the resin portion 13 placed in the retainer opening 12 in the metal portion 11 is swelled by being impregnated with a first liquid. As described above, when a semiconductor wafer is subjected to repeated double-side polishing steps, the resin portion 13 absorbs moisture such as slurry or pure water and swells. Accordingly, the thickness of the resin portion 13 becomes larger than the thickness of the metal portion 11, and the flatness of the semiconductor wafer is reduced while the wafer is polished.

To address this, the resin portion 13 is swelled by being impregnated with a liquid (first liquid). Thus, the resin portion 13 absorbs moisture such as slurry or pure water to be in a swelling state as in the double-side polishing step. Accordingly, in Step S4, polishing is performed so that the thickness of the resin portion 13 in the swelling state and the thickness of the metal portion 11 are approximately the same. Thus, even if the double-side polishing step is repeated, the reduction in the flatness of the surfaces of a semiconductor wafer can be prevented.

This production stage swelling step can be performed by continuously pouring the first liquid to the resin portion 13. Alternatively, this step may be performed by immersing at least the resin portion 13 in the first liquid. Of these, the production stage swelling step is preferably performed by immersing the resin portion 13 in the first liquid, since the resin portion 13 can easily be impregnated with the first liquid.

Further, the production stage swelling step is preferably performed for 24 hours or more. Thus, the resin portion 13 can be swelled by being sufficiently impregnated with the liquid (first liquid). This step is preferably performed for 48 hours of more, more preferably 60 hours or more.

This step is preferably performed until the rate of change in the thickness of the resin portion 13 per 24 hours becomes 0.2% or less. Thus, the resin portion 13 can be swelled by being sufficiently impregnated with the first liquid.

For the first liquid, a slurry, water, an aqueous solution containing a surfactant, etc. can be used. Among these, water is preferably used in terms of availability and handleability.

Next, in Step S4, both surfaces of the resin portion 13 having been swelled in Step S3 are polished so that the thickness of the swelled resin portion 13 and the thickness of the metal portion 11 become approximately the same (resin portion polishing step). Specifically, the thicknesses are made the same by double-side polishing by lapping or polishing. Since resin wears more easily than metal and the thickness of the resin portion 13 is larger, the difference in the thickness is reduced by performing polishing. Note that polishing is preferably performed by placing a work which wears as easily as or more easily than the metal portion 11 in the retainer opening 12. Further, the material of the work is preferably resin or the same material as the metal portion 11.

Thus, the carrier 1 can be produced. In the obtained carrier 1, the thickness of the resin portion 13 and the thickness of the metal portion 11 are approximately the same in the state where the resin portion 13 absorbs moisture and swells. Accordingly, while the double-side polishing is performed repeatedly, the reduction in the flatness of the semiconductor wafer surfaces can be prevented.

Method of Polishing Wafer

Next, a method of polishing a wafer will be described. In the method of polishing a wafer, a semiconductor wafer to be polished is retained in the retainer opening 12 of the carrier 1 produced by the above-described method of producing a carrier, and an upper plate and a lower plate of a double-side polishing apparatus are rotated with the carrier 1 being sandwiched between the upper plate and the lower plate, thereby polishing both surfaces of the semiconductor wafer (wafer polishing step). Here, prior to the wafer polishing step, the resin portion 13 of the carrier 1 is previously impregnated with a liquid (second liquid) to be swelled (polishing stage swelling step).

As described above, in the method of producing a carrier, the resin portion 13 of the carrier 1 is impregnated with the first liquid to be swelled, and both surfaces of the swelled resin portion 13 are polished so that the thickness of the swelled resin portion 13 and the thickness of the metal portion 11 become approximately the same. However, while the produced carrier 1 is stored for a certain period, the first liquid contained in the resin portion 13 is evaporated and the resin portion 13 contracts, thus the thickness of the resin portion 13 becomes smaller than the thickness of the metal portion 11.

The resin portion 13 of the carrier 1 having been stored is dry and its thickness is smaller than the thickness of the metal portion 11. Therefore, when the semiconductor wafer is stored in the retainer opening 12 of the carrier 1 having been stored and a double-side polishing step is started in this state, a semiconductor wafer having high flatness cannot be obtained.

To address this problem, a carrier obtained by the method of producing a carrier is impregnated with a second liquid to be swelled before the double-side polishing step. Accordingly, at the beginning of the double-side polishing step, the thickness of the resin portion 13 and the thickness of the metal portion 11 are approximately the same, thus both surfaces of the semiconductor wafer can be polished while high flatness of the wafer is kept from the beginning of the double-side polishing step. Also in the case where the double-side polishing is repeated, the flatness of the semiconductor wafer surfaces would not be reduced.

This polishing stage swelling step can be performed for example by continuously pouring the second liquid to the resin portion 13 or immersing at least the resin portion 13 in the second liquid as in the production stage swelling step. Above all, this polishing stage swelling step is preferably performed by immersing at least the resin portion 13 in the second liquid, since it can be easily performed.

The time for which the resin portion 13 is impregnated with the first liquid in the above production stage swelling step is preferably the same as the time for which the resin portion 13 is impregnated with the second liquid in the polishing stage swelling step. Thus, even in the double-side polishing for a semiconductor wafer, the thickness of the resin portion 13 and the thickness of the metal portion 11 can be made approximately the same, thereby achieving higher flatness of the polished semiconductor wafer.

As the above second liquid, a slurry, water, an aqueous solution containing a surfactant, etc. can be used as with the first liquid in the production stage swelling step. The second liquid preferably uses the same liquid as the first liquid, and more preferably, water is used since it is readily available and easy to handle.

The semiconductor wafer to be polished in this disclosure is not limited; however, a silicon wafer can be particularly polished well.

EXAMPLES

Examples will now be described in detail; however, this disclosure is not limited to the Examples.

<Evaluation of Water Absorption of Resin>

In association with a method of producing a carrier, according to this disclosure, the water absorption of seven types of resin that could be used as a material of the resin portion 13 of the carrier 1 was evaluated. Specifically, a test piece of 20 mm×20 mm×3.5 mm was prepared for each resin, and its weight $W_b$, was measured. Next, each test piece was immersed in water at a water temperature of 25° C. under a room temperature of 25° C. for 25 hours. Subsequently, after each test piece was taken out of water and moisture on the surface of the test piece was wiped off, the weight $W_a$ of the test piece was measured.

The water absorption $R_a$ of each resin was calculated by the following equation (1). The results are given in Table 1.

$$R_a=(W_a-W_b)/W_b \tag{1}$$

TABLE 1

| Resin | Water absorption (%) |
|---|---|
| Aramid | 0.25 |
| Nylon-polyamide (PA) | 1.6 |
| Polyacetal (POM) | 0.25 |
| Polyvinyl chloride (PVC) | 0.07 |
| Polypropylene (PP) | 0.01 |
| Polyvinylidene fluoride (PVDF) | 0.04 |
| Fluorine-based resin (PFA/ETFE) | 0.03 |

Table 1 indicates that the water absorption varies greatly depending on the material of the resin; the water absorption of nylon-polyamide (PA) is as high as 1.6%, and by contrast, the water absorption of polypropylene (PP) is as low as 0.01%.

Example 1

The carrier 1 was produced in accordance with the flow chart presented in FIG. 2. Specifically, a carrier shape was formed by laser machining using SUS316 as a material of the metal portion 11 serving as a carrier base, and milling and heat treatment were then performed, followed by lapping and polishing, thus the metal portion 11 was prepared. Next, polyamide was used as a material of the resin portion 13 in the retainer opening 12 of the metal portion 11, and the retainer opening 12 was filled with polyamide by injection molding. Subsequently, the resin portion 13 was formed by forming an opening for retaining a wafer in the polyamide resin charged into retainer opening 12, thus the carrier 1 was obtained.

Example 2

A carrier was produced in accordance with a method of producing a carrier, according to this disclosure, as in Example 1. Here, aramid was used as a material of the resin portion 13. All the other features were the same as those in Example 1.

Example 3

A carrier was produced in accordance with a method of producing a carrier, according to this disclosure, as in Example 1. Here, polypropylene was used as a material of the resin portion 13. All the other features were the same as those in Example 1.

Conventional Example

A carrier was produced in the same manner as in Example 1. However, the production stage swelling step of Step S3 in the flow chart presented in FIG. 2 was not performed. All the other features were the same as those in Example 1.

<Thickness Profile of carrier>

Figure 4A:
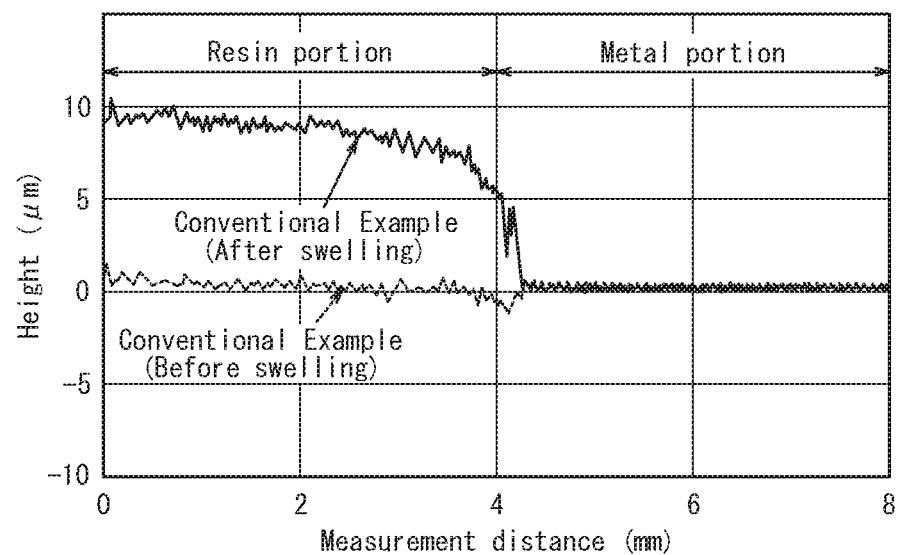
FIG. 4A is a diagram illustrating the thickness profile of a carrier before and after the swelling of a resin portion in Conventional Example.
Figure 4B:
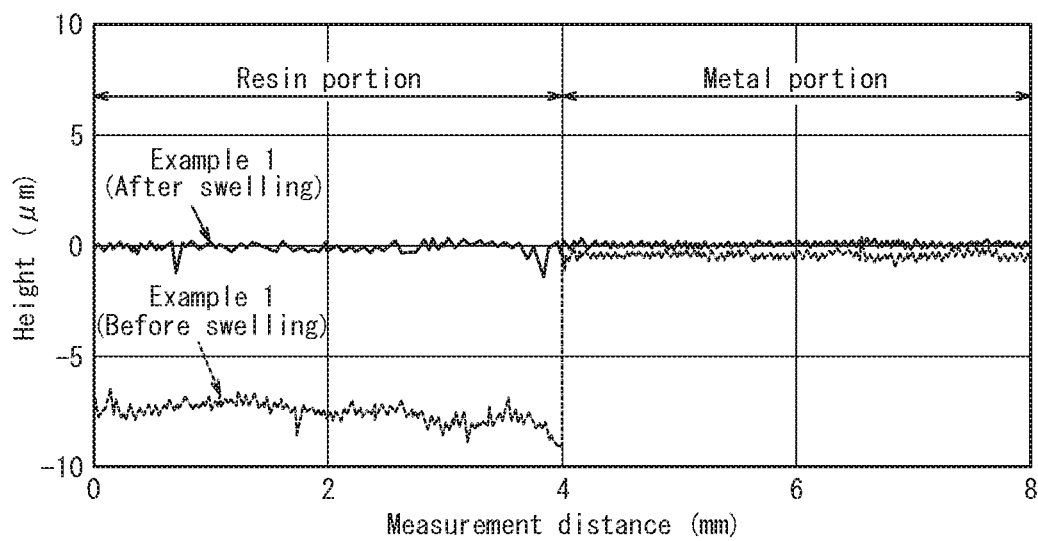
FIG. 4B is a diagram illustrating the thickness profile of a carrier before and after the swelling of a resin portion in Example 1.

FIG. 4 is a diagram depicting the thickness profile of carriers before and after the immersion in water. FIG. 4A involves Conventional Example and FIG. 4B involves Example 1. Each thickness profile after swelling was obtained by the evaluation for the carrier after the immersion of the carrier in water at a water temperature of 25° C. under a room temperature of 25° C. for 25 hours.

As illustrated in FIG. 4A, in Conventional Example, before the carrier 1 was immersed in water to be swelled, the thickness of the resin portion 13 and the thickness of the metal portion 11 were approximately the same, and by contrast, after the carrier 1 was immersed in water to be swelled, the thickness of the resin portion 13 was much larger.

On the other hand, as illustrated in FIG. 4B, in Example 1, although the thickness of the resin portion 13 was smaller than the thickness of the metal portion 11 before the carrier 1 was immersed in water to be swelled, the thickness of the resin portion 13 and the thickness of the metal portion 11 were approximately the same after the carrier 1 was immersed in water.

<Change in Thickness of Resin Portion with Time>

The change in the thickness of the resin portion 13 with time was evaluated for each carrier 1 in Examples 1 to 3. Specifically, each carrier 1 was immersed in water at a water temperature of 25° C. in an environment under a room temperature of 25° C., and the carrier was taken out every 12 hours to measure the thickness of the resin portion 13. The results are given in FIG. 5. Further, the rate of change in the thickness of the resin portion is depicted in FIG. 6.

Figure 5:
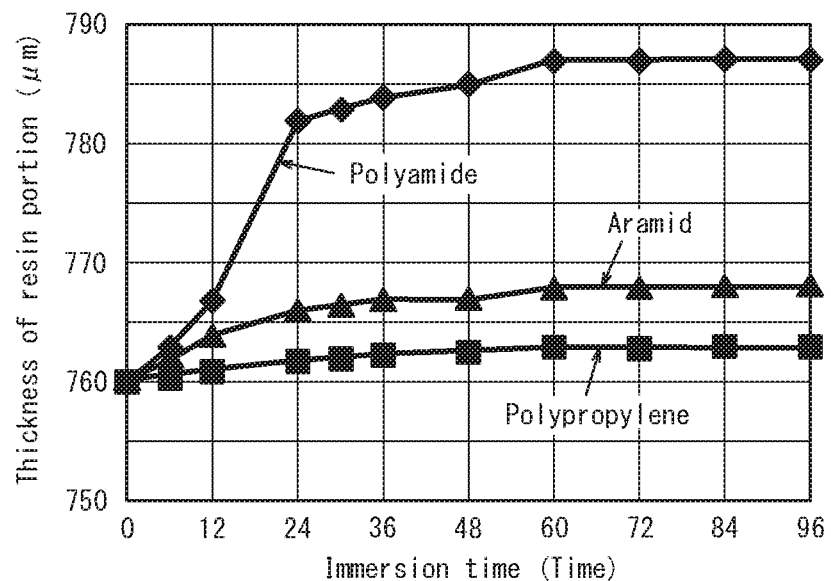
FIG. 5 is a diagram illustrating the relationship between the time of immersion in water and the thickness of a resin portion in Examples 1 to 3.
Figure 6:
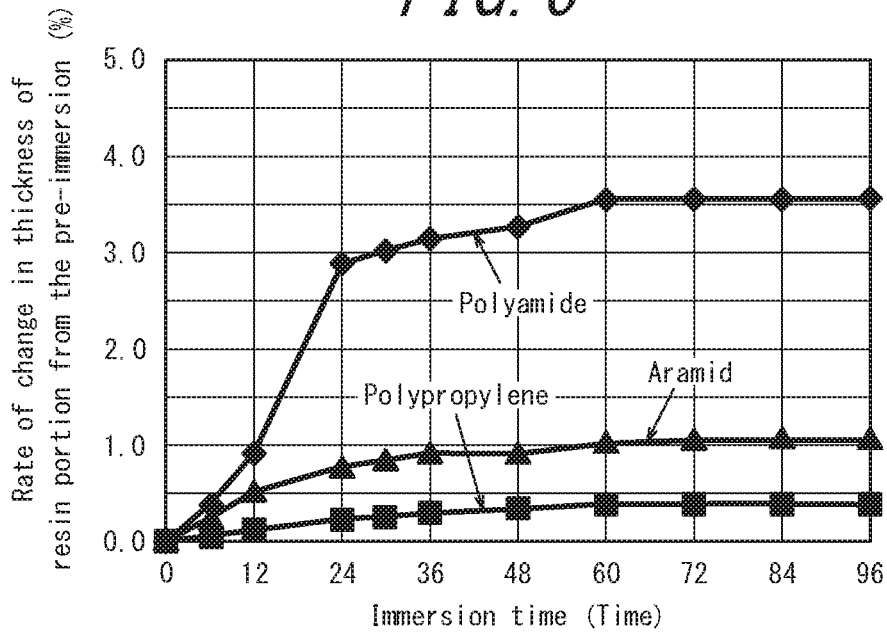
FIG. 6 is a diagram illustrating the relationship between the time of immersion in water and the rate of change in the thickness of the resin portion in Examples 1 to 3.

As illustrated in FIGS. 5 and 6, the change in the thickness of the resin portions with time reflects the water absorption given in Table 1. Specifically, in Example 1 using polyamide having high water absorption as a material of the resin portion 13, the change in the thickness of the resin portion 13 was large, and the thickness of the resin portion 13 after 96 hours from the immersion was larger by approximately 3.6% as compared with the thickness before the immersion. On the other hand, in Example 2 using aramid as a constituent material of the resin portion 13 and Example 3 using polypropylene, the rates of increase in the thickness of the resin portion 13 in 96 hours after the immersion were as small as approximately 1.1% and approximately 0.4%, respectively.

Further, in each case of Examples 1 to 3, the rate of change in the thickness of the resin portion 13 was 2.0% or less after 24 hours from the immersion, and it was found that the thickness of the resin portion 13 little changed after a lapse of over 60 hours from the immersion.

<Evaluation of Wafer Flatness after Double-Side Polishing Step>

A double-side polishing step for a silicon wafer was repeated 100 times using the carrier 1 of Example 1 and Conventional Example. Specific polishing conditions were as follows.

Polishing Conditions

Polishing cloth: SUBA 800 (produced by Nitta Haas Incorporated)
Slurry: Nalco 2350 (available from Nitta Haas Incorporated)
Plate rotation speed: 20 rpm-30 rpm
Working pressure: 300 g/cm$^2$
Wafer diameter: 300 mm
Wafer thickness: 790 μm
Carrier thickness: 778 μm
Wafer target thickness: 780 μm The flatness of the surfaces of the silicon wafer having been subjected to the double-side polishing was measured per batch. The measurement conditions were as follows.

Measurement Equipment

Figure 7A:
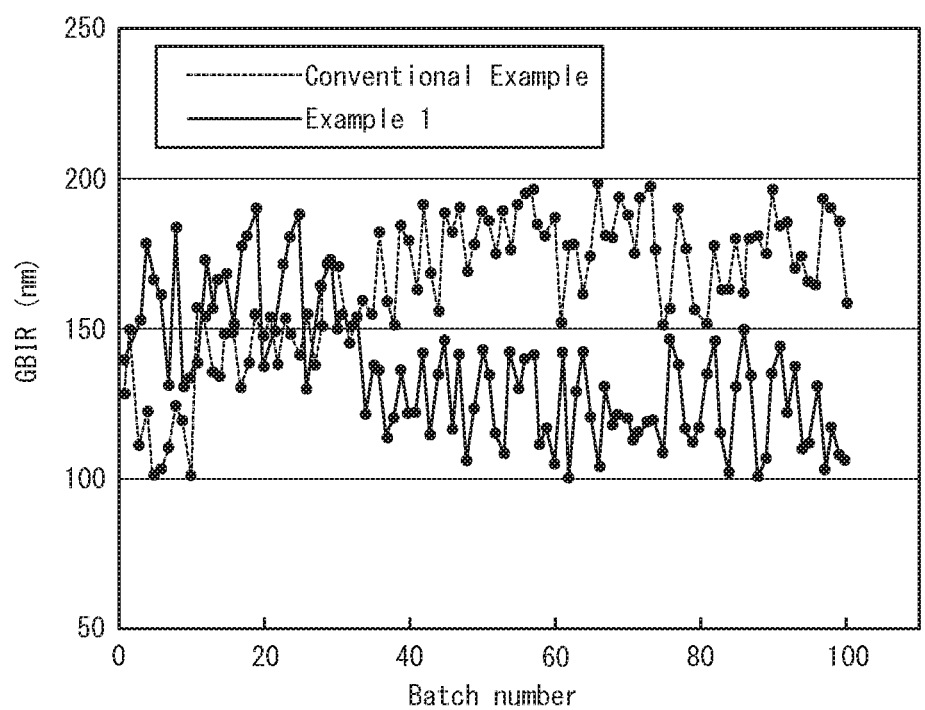
FIG. 7A is a diagram illustrating the relationship between the number of batches for polishing and the GBIR after a double-side polishing step in the case where a carrier was not immersed in water before the polishing.
Figure 7B:
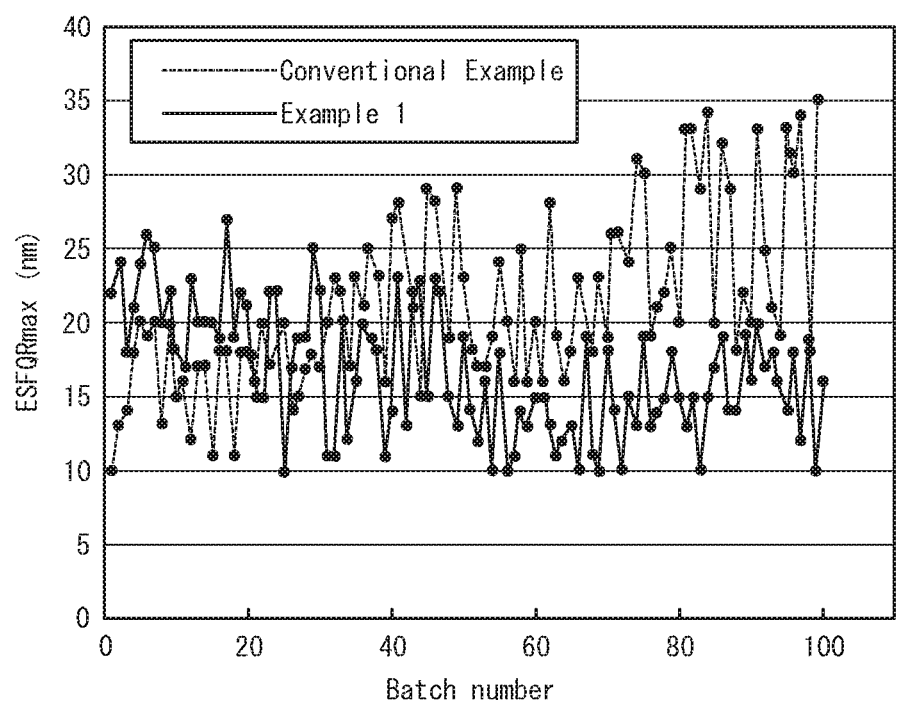
FIG. 7B is a diagram illustrating the relationship between the number of batches for polishing and the $ESFQR_{max}$ after a double-side polishing step in the case where a carrier was not immersed in water before the polishing.

Measurement system: WaferSight 2 manufactured by KLA-Tencor Corporation
Measured items: GBIR, ESFQR$_{max}$
Measurement conditions: Measuring range: Range of 296 mm in wafer diameter direction excluding a range of 2 mm from the periphery
Esite measurement, 72 sectors, sector length: 30 mm FIGS. 7A and 7B illustrate the relationship between the number of batches for polishing and the flatness of the polished semiconductor wafer in the case where the carrier 1 was not immersed in water before the double-side polishing step. FIG. 7A illustrates the GBIR, and FIG. 7B illustrates the ESFQR$_{max}$. FIG. 7A illustrates that the value of GBIR was smaller for the carrier 1 in Conventional Example than that in Example 1 at the stage where the number of batches was small. However, the value of GBIR increased with the increase of the number of batches. This indicates that the flatness of the whole polished silicon wafer was deteriorated.

On the other hand, the value of GBIR was larger for the carrier 1 in Example than that in Conventional Example 1 at the stage where the number of batches was small. This was probably due to a large difference between the thickness of the resin portion 13 and the thickness of the metal portion 11, caused because the resin portion 13 was dry. However, the value of GBIR decreased with the increase of the number of batched, and at the stage of over 30 batches, the values of GBIR in Example 1 and Conventional Example reversed and the value in Example 1 became smaller than the value in Conventional Example. This would be because the resin portion 13 in the carrier 1 of Example 1 absorbed moisture of the slurry and pure water as the number of batches increased, and the thickness of the resin portion 13 and the thickness of the metal portion 11 approximately matched, whereas the resin portion 13 in Conventional Example absorbed the slurry and pure water and the difference between the thickness of the resin portion 13 and the thickness of the metal portion 11 became larger.

The tendencies found for GBIR were also found for $ESFQR_{max}$. Namely, as illustrated in FIG. 7B, the value of $ESFQR_{max}$ increased with the increase in the number of batches in Conventional Example. By contrast, for the carrier 1 produced by Example 1, the value of $ESFQR_{max}$ decreased with the increase of the number of batches. The values of $ESFQR_{max}$ in Example 1 and Conventional Example reversed when the number of batches exceeded 20, and the value in Example 1 was smaller than the value in Conventional Example in the end.

The above demonstrates that when a double-side polishing step is performed on a silicon wafer using the carrier 1 produced by Example 1, the flatness of both the whole wafer and the wafer periphery was improved with the increase in the number of batches, and the flatness of the surfaces of the polished silicon wafer had better flatness than in the case of using the carrier 1 produced by Conventional Example in the end.

Figure 8A:
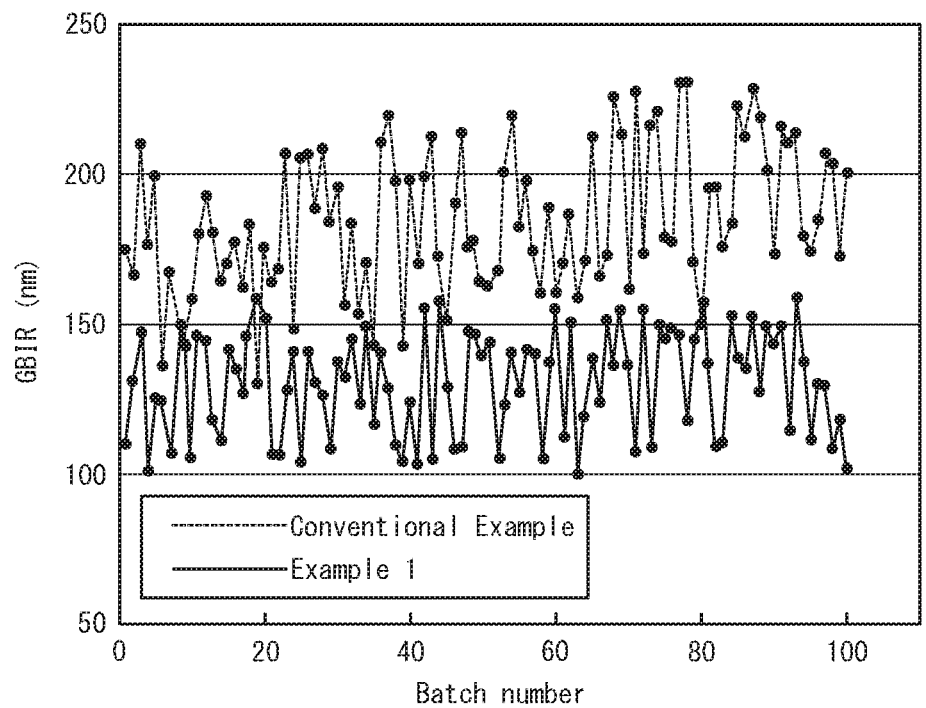
FIG. 8A is a diagram illustrating the relationship between the number of batches for polishing and the GBIR after a double-side polishing step in the case where a carrier was immersed in water before the polishing.
Figure 8B:
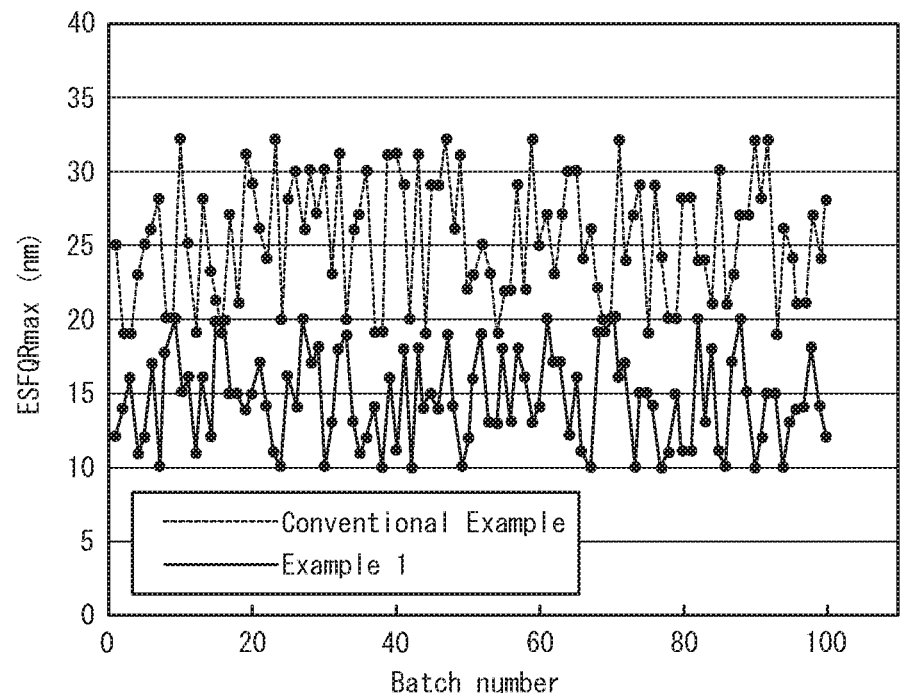
FIG. 8B is a diagram illustrating the relationship between the number of batches for polishing and the $ESFQR_{max}$ after a double-side polishing step in the case where a carrier was immersed in water before the polishing.

FIG. 8 illustrates the GBIR and $ESFQR_{max}$ in the case where prior to the double-side polishing step for a silicon wafer, the carriers produced by Example 1 and Conventional Example were immersed in water at a water temperature of 25° C. for 24 hours, followed by a batch process of double-side polishing. As can be seen from FIG. 8A and FIG. 8B, as compared with the case where the double-side polishing step was performed without immersing the carrier in water, the GBIR and $ESFQR_{max}$ were almost unchanged and stayed constant even when the number of batches increased. The above demonstrates that immersing the carrier in water before the double-side polishing step makes it possible to perform the double-side polishing step while keeping high flatness from the initial batch.

INDUSTRIAL APPLICABILITY

Thus, even when a semiconductor wafer is subjected to repeated double-side polishing steps, the reduction in the flatness of the semiconductor wafer can be prevented. Accordingly, the disclosed product and methods are useful in the semiconductor wafer manufacturing industry.

REFERENCE SIGNS LIST

1: Carrier
11: Metal portion
12: Retainer opening
12a: Inner wall
13: Resin portion

The invention claimed is:

1. A method of producing a carrier including a metal portion having a retainer opening for retaining a semiconductor wafer, and a ring-shaped resin portion that is placed along an inner wall defining the retainer opening in the metal portion and protects a peripheral portion of the semiconductor wafer, comprising:
    preparing the metal portion and the resin portion;
    placing the resin portion in the retainer opening in the metal portion; and
    polishing both surfaces of the resin portion,
    wherein the method comprises, prior to the resin portion polishing, swelling the resin portion placed in the retainer opening in the metal portion by impregnating the resin portion with a first liquid.

2. The method of producing a carrier, according to claim 1, wherein the swelling is performed by immersing at least the resin portion in the first liquid.

3. The method of producing a carrier, according to claim 1, wherein the swelling is performed for 24 hours or more.

4. The method of producing a carrier, according to claim 1, wherein the swelling is performed until a rate of change in a thickness of the resin portion per 24 hours becomes 0.2% or less.

5. The method of producing a carrier, according to claim 1, wherein the first liquid is one of water, a slurry, and an aqueous solution containing a surfactant.

6. The method of producing a carrier, according to claim 1, wherein the resin portion is made of one of aramid, polyamide, polyacetal, polyvinyl chloride, polypropylene, polyvinylidene fluoride, and a fluorine-based resin.

7. The method of producing a carrier, according to claim 1, wherein the resin portion contains glass fiber.

8. A method of polishing a wafer, comprising polishing both surfaces of a semiconductor wafer by retaining the semiconductor wafer in the retainer opening of the carrier produced by the method of producing a carrier, according to claim 1, and rotating an upper plate and a lower plate of a double-side polishing apparatus with the carrier being sandwiched between the upper plate and the lower plate,
    wherein the method of polishing a wafer comprises, prior to the wafer polishing, swelling the resin portion in the carrier by impregnating the resin portion with a second liquid.

9. The method of polishing a wafer, according to claim 8, wherein the swelling is performed by immersing at least the resin portion in the second liquid.

10. The method of polishing a wafer, according to claim 8, wherein a time for which the resin portion is impregnated with the first liquid and a time for which the resin portion is impregnated with the second liquid are the same.

11. The method of polishing a wafer, according to claim 8, wherein the second liquid is the same as the first liquid.

12. The method of polishing a wafer, according to claim 8, wherein the second liquid is one of water, a slurry, and an aqueous solution containing a surfactant.

13. The method of polishing a wafer, according to claim 8, wherein the semiconductor wafer is a silicon wafer.

14. A method of polishing a wafer, comprising polishing both surfaces of a semiconductor wafer by retaining the semiconductor wafer in the retainer opening of the carrier produced by the method of producing a carrier, according to claim 2, and rotating an upper plate and a lower plate of a double-side polishing apparatus with the carrier being sandwiched between the upper plate and the lower plate,
    wherein the method of polishing a wafer comprises, prior to the wafer polishing, swelling the resin portion in the carrier by impregnating the resin portion with a second liquid.

15. A method of polishing a wafer, comprising polishing both surfaces of a semiconductor wafer by retaining the semiconductor wafer in the retainer opening of the carrier produced by the method of producing a carrier, according to claim 3, and rotating an upper plate and a lower plate of a double-side polishing apparatus with the carrier being sandwiched between the upper plate and the lower plate, wherein the method of polishing a wafer comprises, prior to the wafer polishing, swelling the resin portion in the carrier by impregnating the resin portion with a second liquid.

16. A method of polishing a wafer, comprising polishing both surfaces of a semiconductor wafer by retaining the semiconductor wafer in the retainer opening of the carrier produced by the method of producing a carrier, according to claim 4, and rotating an upper plate and a lower plate of a double-side polishing apparatus with the carrier being sandwiched between the upper plate and the lower plate, wherein the method of polishing a wafer comprises, prior to the wafer polishing, swelling the resin portion in the carrier by impregnating the resin portion with a second liquid.

17. A method of polishing a wafer, comprising polishing both surfaces of a semiconductor wafer by retaining the semiconductor wafer in the retainer opening of the carrier produced by the method of producing a carrier, according to claim 5, and rotating an upper plate and a lower plate of a double-side polishing apparatus with the carrier being sandwiched between the upper plate and the lower plate, wherein the method of polishing a wafer comprises, prior to the wafer polishing, swelling the resin portion in the carrier by impregnating the resin portion with a second liquid.

18. A method of polishing a wafer, comprising polishing both surfaces of a semiconductor wafer by retaining the semiconductor wafer in the retainer opening of the carrier produced by the method of producing a carrier, according to claim 6, and rotating an upper plate and a lower plate of a double-side polishing apparatus with the carrier being sandwiched between the upper plate and the lower plate, wherein the method of polishing a wafer comprises, prior to the wafer polishing, swelling the resin portion in the carrier by impregnating the resin portion with a second liquid.

19. A method of polishing a wafer, comprising polishing both surfaces of a semiconductor wafer by retaining the semiconductor wafer in the retainer opening of the carrier produced by the method of producing a carrier, according to claim 7, and rotating an upper plate and a lower plate of a double-side polishing apparatus with the carrier being sandwiched between the upper plate and the lower plate, wherein the method of polishing a wafer comprises, prior to the wafer polishing, swelling the resin portion in the carrier by impregnating the resin portion with a second liquid.

* * * * *